US010859608B1

(12) United States Patent
Shah et al.

(10) Patent No.: US 10,859,608 B1
(45) Date of Patent: Dec. 8, 2020

(54) ACTIVE INPUT VOLTAGE SENSING FOR LOW VOLTAGE ANALOG SIGNAL DETECTION

(71) Applicant: Rockwell Automation Asia Pacific Business Centre Pte. Ltd., Singapore (SG)

(72) Inventors: Rajesh R. Shah, Singapore (SG); Michael C. Tumabcao, Philippines (PH)

(73) Assignee: Rockwell Automation Asia Pacific Business Centre Pte. Ltd., Singapore (SG)

( * ) Notice: Subject to any disclaimer, the term of this patent is extended or adjusted under 35 U.S.C. 154(b) by 0 days.

(21) Appl. No.: 16/448,458

(22) Filed: Jun. 21, 2019

(51) Int. Cl.
*H03K 5/153* (2006.01)
*G01R 19/00* (2006.01)
*H03K 3/3565* (2006.01)

(52) U.S. Cl.
CPC ....... *G01R 19/0053* (2013.01); *H03K 3/3565* (2013.01)

(58) Field of Classification Search
CPC ............ H03K 3/02337; H03K 3/2885; H03K 3/2893; H03K 3/3565; H03K 3/0377; H03K 5/08; H03K 5/082; H03K 5/2481; H03K 5/249; H03K 5/153
See application file for complete search history.

(56) References Cited

U.S. PATENT DOCUMENTS

| 6,988,053 B2 * | 1/2006 | Namaky | G01R 31/007 |
| | | | 702/183 |
| 2005/0162207 A1 * | 7/2005 | Kamei | H03K 3/02337 |
| | | | 327/205 |

\* cited by examiner

*Primary Examiner* — Long Nguyen
(74) *Attorney, Agent, or Firm* — Boyle Frederickson, SC (57) ABSTRACT

An input circuit for detecting low voltage analog signals in an electrically noisy environment receives the analog input signal at an input terminal. The analog input signal is compared to a variable reference signal at a comparator circuit. An active hysteresis circuit provides feedback to the comparator. In a first operating mode, the active hysteresis circuit may be disabled or be configured to output a constant voltage. In a second operating mode, the active hysteresis circuit may be enabled or configured to output a varying level of voltage. The output of the feedback circuit is summed with the variable reference signal and supplied as the input signal to the comparator, such that signal against which the analog input signal is compared is a general constant value in the first operating mode and varies with respect to time in the second operating mode.

20 Claims, 4 Drawing Sheets

ACTIVE INPUT VOLTAGE SENSING FOR LOW VOLTAGE ANALOG SIGNAL DETECTION

BACKGROUND INFORMATION

The subject matter disclosed herein relates to the field of industrial automation, and more specifically, to an input module with active hysteresis and an adjustable reference to detect an analog signal in an electrically noisy environment.

Industrial controllers are specialized computer systems used for the control of industrial processes or machinery, for example, in a factory environment. Generally, an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. As part of their enhanced modularity, industrial controllers may employ input and output modules or various other modules and devices dedicated to a particular type of electrical signal and function, for example, detecting AC or DC input signals or controlling AC or DC output signals. Each of these modules may have a connector system allowing them to be installed in different combinations in a housing or rack along with other selected modules or devices to match the demands of the particular application. Multiple or individual modules or devices may be located at convenient control points near the controlled process or machine to communicate with a central industrial controller via the control network.

One such input module may be configured to detect an analog input signal in an electrically noisy environment. An electrically noisy environment includes sources of electromagnetic noise that may be radiated and/or conducted between the source of the electromagnetic noise and a circuit located within the environment. One source of electromagnetic noise may be electric machines. Operation of the electric machine may further include modulation techniques for controlling the machine in a motoring mode of operation or for transferring power from the machine in a generating mode of operation. Machines with greater power ratings have correspondingly greater amplitudes of voltage and/or current such that electromagnetic noise generated by the machine correspondingly has a greater amplitude. Modulation techniques include switching power electronic devices on and off, often at frequencies in the tens or hundreds of kilohertz, where the modulation generates voltages and/or currents having periodic waveforms at the switching frequencies or harmonics thereof. These periodic waveforms similarly may be sinusoidal, square-waves, or various other waveshapes. While a sinusoidal waveform may include a single frequency at the switching frequency or a harmonic thereof, square-waves and various other waveshapes resulting from modulation are composed of multiple frequency components and/or harmonic components thereof.

A sensor operating in this electrically noisy environment may have limitations imposed on its operation as a result of the environment. In particular, detection of voltage signals having a low magnitude is challenging in such an environment. The magnitude of noise present on an electrical conductor connected between the sensor and a the I/O module may exceed the magnitude of the signal to be measured and may be, for example, three to five times as great as the signal to be measured. As a result, the sensor may not be able to operate across its full sensing range, but rather operate only to a point where the output from the sensor yields a signal-to-noise ratio great enough to distinguish the signal from the noise.

In order to expand the operating range of a sensor in such an environment, it may be possible to filter some of the electromagnetic noise. As an initial option, the input module may utilize a differential input signal from the sensor, the differential input signals are supplied to a differential amplifier, which may filter some of the undesired noise present on the input signal. However, additional filtering is commonly required and may require multiple filters such as a low-pass filter, a high-pass filter, a band-pass filter, or a combination thereof. In addition, different filters may be required for different operating points of the equipment. The differential input requires two input terminals on the input module rather than a single input terminal. The differential amplifiers and additional filters require space on the circuit board for each input channel and add cost and complexity to the input module.

Thus, it would be desirable to provide an improved input circuit to detect analog input signals on an input module. It would also be desirable to provide an improved input circuit able to sense low voltage analog signals in an electrically noisy environment.

BRIEF DESCRIPTION

The subject matter disclosed herein describes an input circuit for detecting analog input signals on an input module and, more specifically, an input circuit able to sense low voltage analog signals in an electrically noisy environment. The input circuit has an input terminal at which the analog input signal is received. The input circuit also includes a variable reference signal, where the variable reference signal is set to a first reference signal in a first operating mode and to a second reference signal in a second operating mode. The variable reference signal is provided to a summing junction and is combined with the output of a feedback circuit. The combination of the variable reference signal and the output of the feedback circuit is compared to the analog input signal.

In one embodiment of the invention, an operational amplifier is provided to perform the comparison between the two signals. The combination of the variable reference signal and the output of the feedback circuit is provided as a first input to the operational amplifier and the analog input signal is provided as a second input to the operational amplifier. When the first input to the operational amplifier is greater than the second input, a first voltage is output from the operational amplifier. When the first input to the operational amplifier is less than the second input, a second voltage is output from the operational amplifier. The output of the operational amplifier is provided as an input to the feedback circuit.

The feedback circuit provides an active hysteresis circuit which is active in only one operating mode. In the first operating mode, the active hysteresis circuit may be disabled or be configured to output a constant voltage. The summation of the output of the feedback circuit with the variable reference signal in the first operating mode provides a generally constant voltage as an input to the operational amplifier. In the second operating mode, the active hysteresis circuit may be enabled or configured to output a varying level of voltage. The level of voltage output may be set, for example, to follow the response of a resistive-capacitive circuit in the feedback path. The summation of the output of the feedback circuit with the variable reference signal in the second operating mode, therefore, provides a time-variant input signal to the operational amplifier.

According to one embodiment of the invention, an input circuit for detecting an analog signal is disclosed. The input circuit includes a terminal, a variable reference signal, a comparator circuit, and an active hysteresis circuit. The terminal is configured to receive the analog signal at the input circuit, and the variable reference signal is operative to equal a first reference signal in a first operating mode and a second reference signal in a second operating mode. The comparator circuit includes a first input, a second input, and an output, where the first input is operative to receive the variable reference signal and the second input is operative to receive the analog signal. The active hysteresis circuit includes an input and an output, where the input of the active hysteresis circuit is configured to receive the output from the comparator circuit and the output of the active hysteresis circuit is added to the variable reference signal. The output of the active hysteresis circuit is a constant value in the first operating mode, and the output of the active hysteresis circuit is a varying value during the second operating mode.

According to another embodiment of the invention, a method of detecting an analog signal with an input circuit is disclosed. An analog signal is received at a terminal of the input circuit, and a variable reference signal is generated with the input circuit. The variable reference signal is a first reference signal in a first operating mode and a second reference signal in a second operating mode. An active hysteresis circuit in the input circuit is disabled during the first operating mode and enabled during the second operating mode. The active hysteresis circuit includes an input and an output, where the input of the active hysteresis circuit is configured to receive an output of a comparator circuit, and the output of the active hysteresis circuit is added to the variable reference signal during the second operating mode. The analog signal is compared to the variable reference signal at the comparator circuit in the first operating mode and to the sum of the output of the active hysteresis circuit and the variable reference signal at the comparator circuit in the second operating mode.

According to yet another embodiment of the invention, an input module for an industrial controller includes a terminal, a variable reference signal, a comparator circuit, and an active hysteresis circuit. The terminal is configured to receive an analog signal, and the variable reference signal is set to a first reference signal in a first operating mode and to a second reference signal in a second operating mode. The comparator circuit includes a first input, a second input, and an output, where the first input is operative to receive the variable reference signal and the second input is operative to receive the analog signal. The active hysteresis circuit includes an input and an output, where the input of the active hysteresis circuit is configured to receive the output from the comparator circuit. The active hysteresis circuit is configured to generate an output signal having a constant value in the first operating mode and to generate an output signal having a varying value in the second operating mode.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Figure 1:
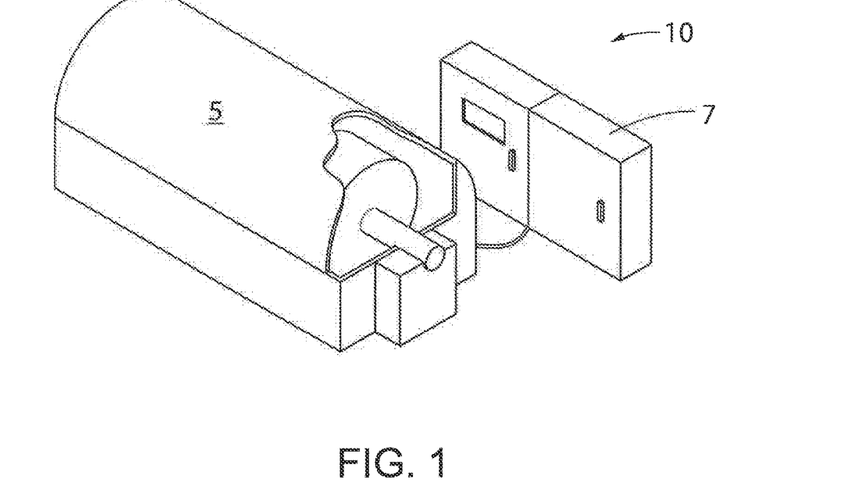
FIG. 1 is an exemplary environment incorporating one embodiment of the invention.

Turning initially to FIG. 1, an exemplary application 10 incorporating one embodiment of the present invention is illustrated. The application 10 includes an electric machine 5 connected to a control cabinet 7. It is contemplated that the electric machine may be configured to operate in a motoring mode of operation, a generating mode of operation, or selectively operate in a combination of motoring and generating modes of operation. In one application, the electric machine 5 may primarily be driven by an external force, such as steam or water passing through turbine blades such that the electric machine 5 is operating as a generator. An industrial controller, such as a programmable logic controller (PLC), is mounted within the control cabinet 7 along with an inverter unit. The industrial controller may receive feedback signals from the electric machine 5 corresponding to operation of the machine 5 and/or other equipment controlled by or used for control of the electric machine. Similarly, the industrial controller may receive feedback signals from a utility grid and from the inverter unit providing status of the utility grid and the inverter unit. The industrial controller may execute a control program to regulate energy flow from the electric machine to the utility grid via the inverter unit within the control cabinet 7.

The industrial controller may be made up of numerous different modules connected together in a rack or mounted to a rail. Additional modules may be added or existing modules removed from the industrial controller to accommodate application requirements Optionally, the industrial controller may have a predetermined and fixed configuration. The industrial controller may include a power supply module, a processor module 13, a network module, one or more input modules 11, and one or more output modules. The input modules 11 and output modules may be selected according to the application requirements. The present invention contemplates at least one input module 1 configured to receive an analog input signal from the electrical machine 5.

Figure 2:
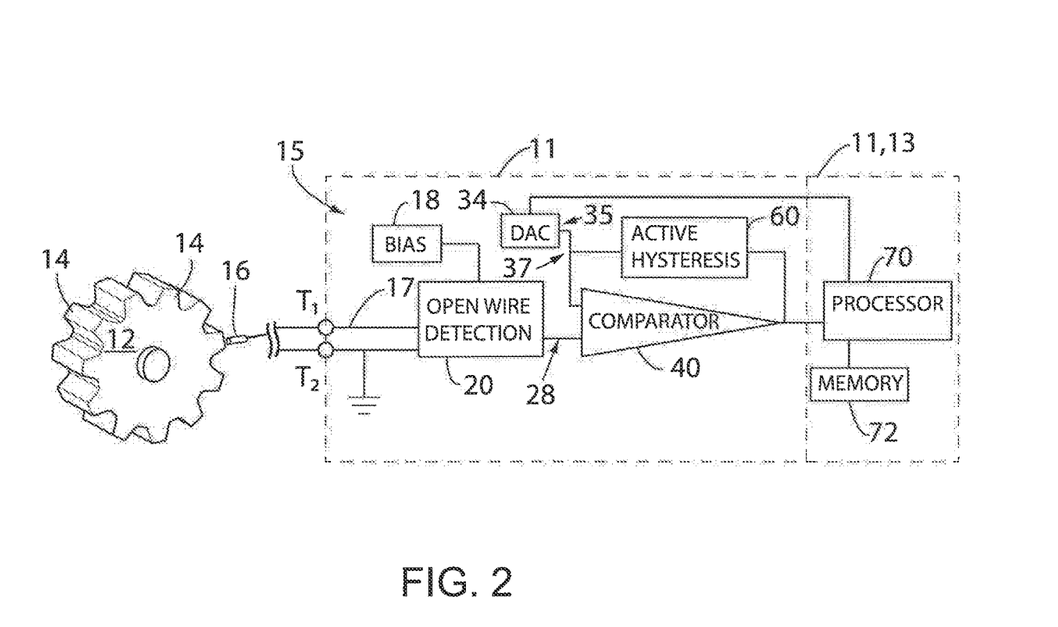
FIG. 2 is a block diagram representation of one embodiment of the invention.

Turning next to FIG. 2, an exemplary analog position feedback sensor 16 is illustrated which generates a signal corresponding to rotation of the electrical machine 5. A gear 12 having a number of teeth 14 spaced around the periphery of the gear is operatively connected to the machine 5. The gear 12 may be directly connected to the machine 5, connected within a gearbox, or connected via some other drive train. Although the illustrated gear 12 includes just five teeth, this is for ease of illustration and is not intended to be limiting. It is contemplated that the gear 12 may include various other numbers of teeth, such as tens or hundreds of teeth without deviating from the scope of the invention. Further, it is contemplated that the sensor 16 may be mounted proximate to other rotating members on or connected to the electrical machine 5 such as vanes used to drive turbine or other members spaced about and rotating around the periphery of the machine 5.

A sensor 16 is mounted proximate the gear 12 to detect each tooth 14 as it passes the sensor 16. According to one embodiment of the invention, the sensor 16 may be a magnetic pick-up sensor, which generates an electromagnetic field and detects the presence of a material passing through the field. The sensor 16 may generate an output signal that varies in amplitude according to a rate of change of the object passing through the magnetic field. Therefore, the amplitude of the signal output from the sensor 16 is greater when the machine 5 is rotating at a higher rate of speed than when the machine 5 is rotating at a lower rate of speed. The sensor 16 may be powered directly from a separate power supply (not shown) or in some applications from a control voltage output from the industrial controller. The control voltage may be +/−3.3 VDC, +/−12 VDC, +/−24 VDC or any other suitable control voltage according to the application requirements. The sensor 16 may be configured to output a signal 17 to the input circuit 15 that has an amplitude near the maximum value of the control voltage supplied to the sensor when the electrical machine 5 is rotating at rated speed. However, the magnitude of the signal 17 decreases across the range of operating speed until it is a low voltage signal at low speed operation of the machine 5. When the machine 5 is not moving, the sensor 16 outputs no signal. It is desirable, for the input circuit 15 to detect the low voltage signal to as small an amplitude as possible in order for the industrial controller and inverter unit to control operation of the electrical machine 5 during low speed operation. It is contemplated that the input circuit 15 will detect the low voltage signal, for example, down to less than a one-volt amplitude and, preferably down to a range of fifty to five hundred millivolts (50-500 mV) in amplitude.

The sensor 16 is connected to and provides the analog signal 17 to the input module 15 at a first terminal, $T_1$. While a second terminal, $T_2$, is also illustrated, the second terminal does not need to be a dedicated terminal for the sensor 16 in the same manner as a differential input. Rather the second terminal is connected to a common reference, such as an earth ground within the input module 11, and each device connected to the input module 11 may be connected to the same common terminal, $T_2$.

Figure 3:
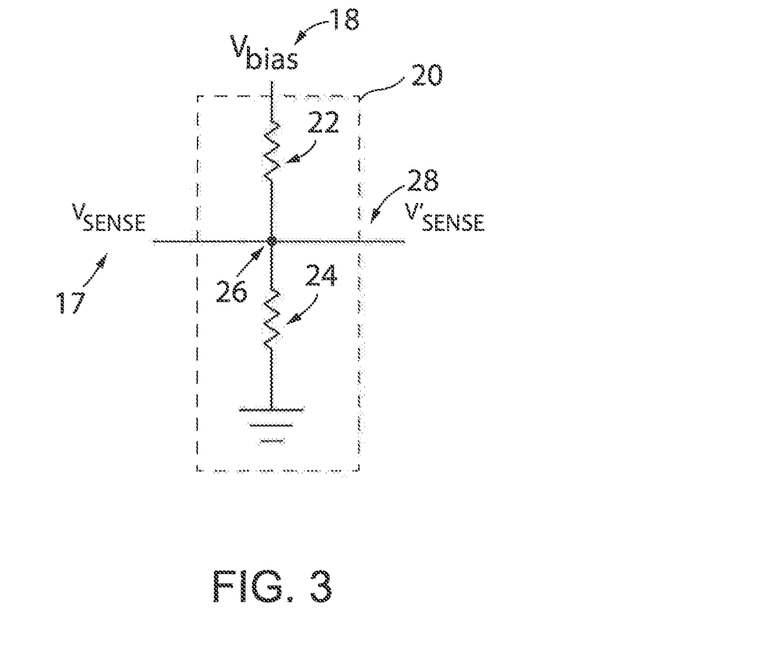
FIG. 3 is a schematic representation of one embodiment of an open wire detection circuit used in FIG. 2.

According to the embodiment of the input circuit 15 shown in FIG. 2, an open wire detection circuit 20 is included. With reference also to FIG. 3, a bias voltage 18, $V_{bias}$, may be supplied to the input circuit 15. A summing junction 26 is provided as which the bias voltage 18 is added to the sensed analog input signal 17, $V_{sense}$, Balancing resistors 22, 24 are provided between the bias voltage, the summing junction 26, and a ground potential to limit and to set the amount of bias voltage applied to the input signal 17. The balancing resistors 22, 24 establish a voltage divider circuit where a portion of the bias voltage 18 is present across each balancing resistor. Further, it is contemplated that each balancing resistor 22, 24 may be a single resistor or a combination of multiple resistors, connected in series, in parallel, or a combination thereof, in order to obtain a desired resistance value. The output 28 of the open wire detection circuit, $V_{sense}'$, includes the sensed analog input signal 17 added on top of a desired bias voltage. According to one embodiment of the invention, the bias voltage may be set to five hundred millivolts (500 mV). The output 28 of the open wire detection circuit is, therefore, equal to 500 mV rather than zero volts (0 V) when the electrical machine is not moving. If the output 28 of the open wire detection circuit is at zero volts, it indicates a broken wire rather than no motion of the electrical machine 5. Rather, than detecting the magnitude of the input signal to 50-500 mV, therefore, the input circuit 15 detects a deviation from the bias voltage down to an amplitude of +/−50-500 mV from the bias voltage.

Figure 4:
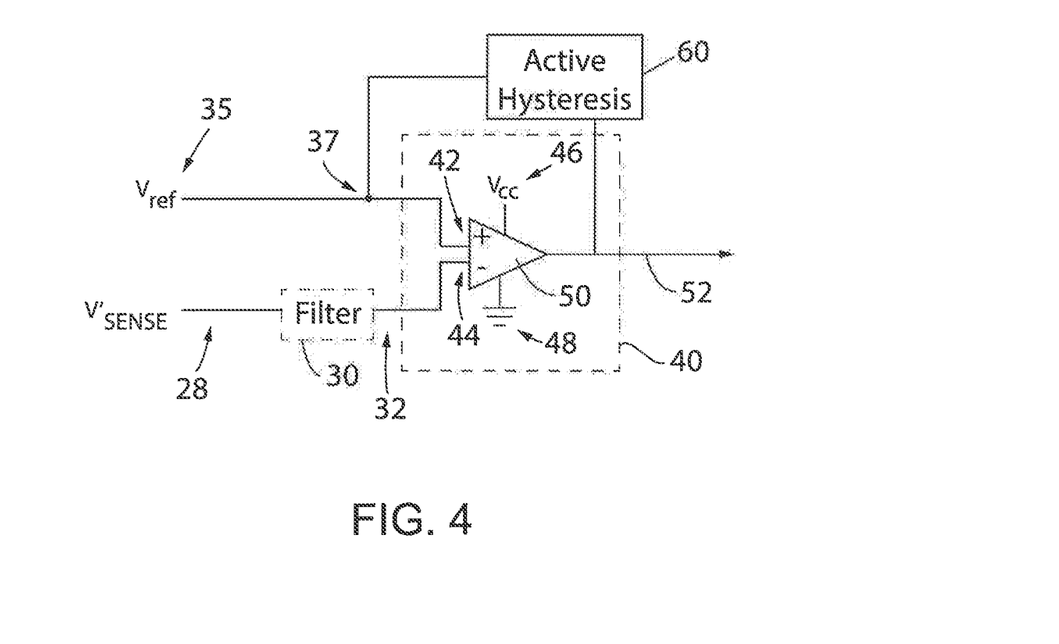
FIG. 4 is a schematic representation of one embodiment of a comparator circuit with active hysteresis feedback used in FIG. 2.

The output of the open wire circuit, $V_{sense}'$, is provided to the comparator circuit 40. With reference also to FIG. 4, one or more filters 30 may be provided between the output of the open wire circuit and the input of the comparator circuit 40 according to the application requirements. Preferably, however, the number of stages of filter circuits 30 is minimized to reduce the component count in the input circuit 15 thereby reducing expense and required surface area on the circuit board. According to one embodiment, a single, two-pole filter 30 is provided between the output of the open wire detection circuit 20 and the input of the comparator circuit 40.

The comparator circuit 40 includes an operational amplifier 50 connected between a positive voltage reference 46, $V_{cc}$, and a negative voltage reference 48 (e.g., a ground or other common connection). A voltage reference 35, $V_{ref}$, is provided as a first input signal 42 to one of the input terminals of the operational amplifier 50 and the output of the filter stage(s) 30, if present, is provided as a second input signal 44 to the other input terminal of the operational amplifier 50. As illustrated, the operational amplifier 50 is connected with the first input signal 42 connected to the non-inverting input and the second input signal 44 is connected to the inverting input. When the value of the sensed voltage signal 28, therefore, is less than the voltage reference signal 35, the output 52 of the comparator circuit 40 goes to the positive voltage reference 46, $V_{cc}$, and when the value of the sensed voltage signal 28 is greater than the voltage reference signal 35, the output 52 of the comparator circuit 40 goes to the negative voltage reference 48.

Figure 5:
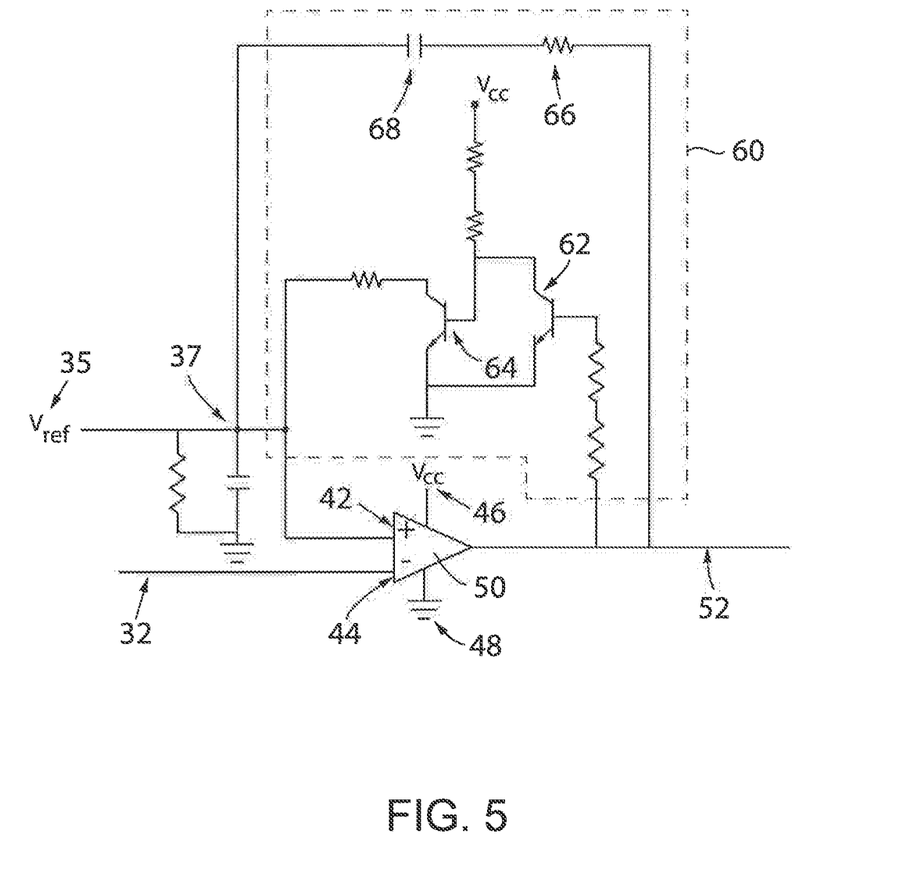
FIG. 5 is a schematic representation of one embodiment of the active hysteresis feedback of FIGS. 2 and 4.

The input circuit 15 for the input module 11 also includes an active hysteresis circuit 60. The active hysteresis circuit 60 receives the output of the comparator circuit 40 as an input and generates an output signal that is summed to the voltage reference 35, $V_{ref}$, at a summing junction 37. With reference also to FIG. 5, the active hysteresis circuit 60 includes a pair of transistors 62, 64 used to enable and disable the active hysteresis circuit 60. Disabling the active hysteresis circuit 60 means that a constant voltage value is output from the circuit 60, and enabling the active hysteresis circuit 60 means that a time varying voltage value is output from the circuit 60. When the output of the comparator circuit 40 is at the positive voltage reference 46, $V_{cc}$, the output of the active hysteresis circuit is a constant value added to the voltage reference signal 35, $V_{ref}$, at the summing junction 37. Preferably, the output of the hysteresis circuit 60 is tied to the common reference point such that the voltage reference signal 35, $V_{ref}$, is provided directly to the input of the comparator op-amp 50. When the output of the comparator circuit 40 is at the negative voltage reference 48 the output of the active hysteresis circuit is defined by the resistor 66 and capacitor 68 connected in series and, therefore, varies in time. The initial value output from the active hysteresis circuit corresponds to the negative voltage reference 48 output from the comparator op-amp 50. Over time, however, the output of the of the active hysteresis circuit charges according to the time constant defined by the resistor 66 and capacitor 68, such that the value being added to the voltage reference signal is a time-variant signal when the output of the comparator circuit 40 is at the negative voltage reference 48.

Figure 6A:
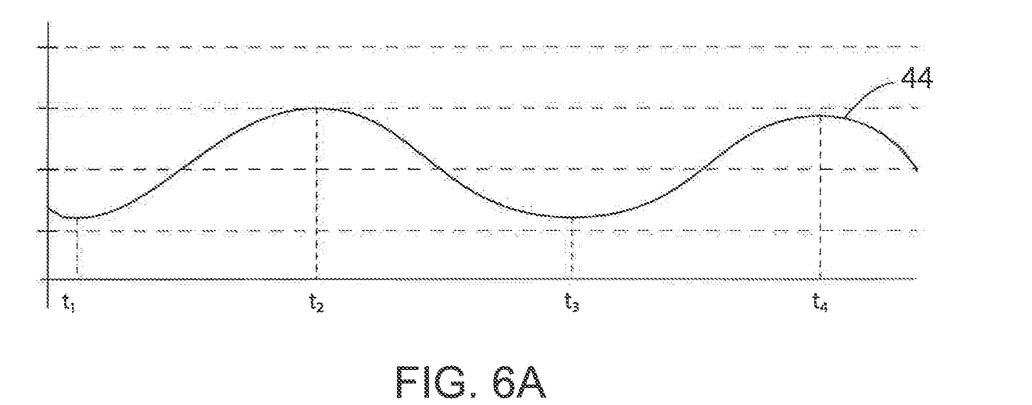
FIG. 6A is a graphical representation of an exemplary analog input signal provided as an input to the comparator in the input circuit of FIG. 2.
Figure 6B:
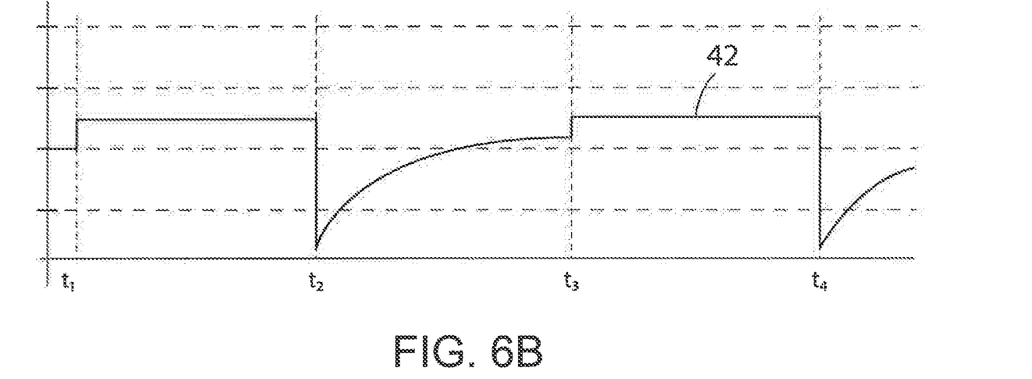
FIG. 6B is a graphical representation of an exemplary variable reference signal summed with the output of the active hysteresis circuit and provided as an input to the comparator of FIG. 2.
Figure 6C:
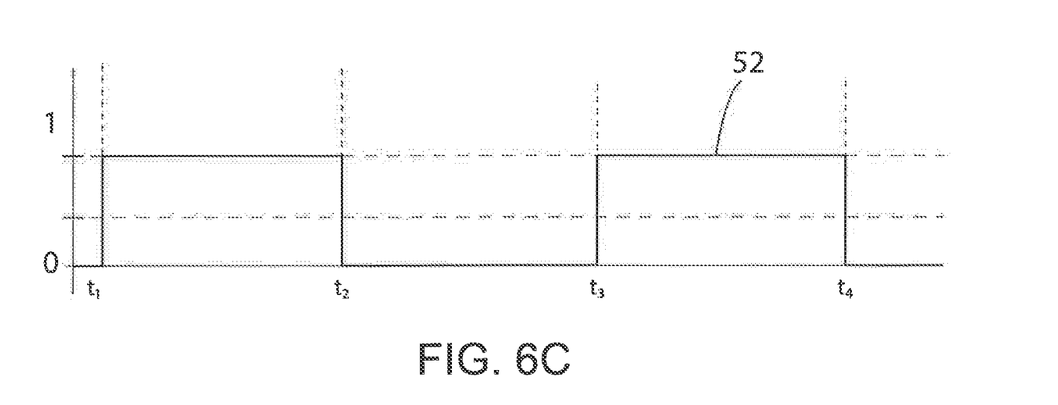
FIG. 6C is a graphical representation of an output signal from the comparator circuit of FIG. 2.

In operation, the input circuit 15 is operative to detect low voltage analog input signals. With reference also to FIGS. 6A-6C, exemplary waveforms at the comparator 50 of the input circuit 15 during operation are illustrated. FIG. 6A illustrates an exemplary input 44 to the comparator 50 which includes both the analog input signal 17 generated by the sensor 16 and a voltage bias offsetting the waveform above zero volts. The analog input signal is operative to detect rotation of the electric machine 5. The sensor generates an electromagnetic field that interacts with the teeth 14 on the gear 12. As a tooth 14 approaches the sensor 16 the magnitude of the signal 17 increases. As a tooth 14 moves away from the sensor 16 and the sensor 16 spans a space between teeth, the magnitude of the signal 17 decreases. Thus, the image in FIG. 6A indicates the rotation of two teeth past the sensor 16. If the machine 5 is rotating at a constant speed, the illustrated analog input signal 17 is generally sinusoidal. Optionally, the waveform could take various other forms, such as sawtooth, trapezoidal, square, or an irregular waveform without deviating from the scope of the invention.

As the speed of rotation increases, the magnitude of the analog input signal 17 similarly increases. The increased magnitude of the analog input signal 17 results in an increase in the signal-to-noise ratio and, therefore makes detection of the analog input signal 17 more robust when the electric machine 5 is operating at higher speeds. However, it is also desirable to control the machine 5 during low speed operation where the magnitude of the analog input signal is low. To control operation of the machine 5 a precise measurement of the analog input signal at all times is not required, but rather it is sufficient, for example, to detect each tooth and determine the duration of time between detecting successive teeth. With a preset knowledge of the pitch between teeth, the speed of rotation for the machine 5 may be determined by the time it takes each successive tooth to pass the sensor 16.

The present invention utilizes the time varying waveform of the signal 17 generated by the sensor 16 to detect the presence of successive teeth 14 passing the sensor 16 and thereby determine the speed of rotation of the electrical machine 5. As seen in FIGS. 6A-6C, the input circuit 15 is configured to operate in two different operating modes. A first operating mode is defined between times $t_1$ and $t_2$ and a second operating mode is defined between times $t_2$ and $t_3$. Each operating mode is configured to execute on one half cycle of the periodic waveform 44 received from the analog input sensor. Thus, the operating modes alternately repeat. The input circuit 15 is again in the first operating mode between times $t_3$ and $t_4$ and enters the second operating mode at time $t_4$, extending off the visual graphs presented.

During the first operating mode, the variable reference signal 35, $V_{ref}$ is set to a first reference value. With reference again to FIG. 2, a processor 70 operative to execute a control program sets a desired reference signal. The processor 70 is in communication with memory 72 where the control program may be stored and, similarly, set points for the desired reference signals may be stored. According to one embodiment of the invention, the input module 11 may include the processor 70 and memory 72 and the entire input circuit 15 may be contained within the input module 11. According to another embodiment of the invention, the processor 70 and memory 72 may be located in the processor module 13 of the industrial controller. The input module 11 typically communicates with the processor module 13 via a backplane extending between each module in the industrial controller. Thus, a portion of the input circuit 15 may be located within each of the input module 11 and the processor module 13. The first reference value is transmitted to a digital-to-analog converter (DAC) 34 which converts the digital value generated by the processor to an analog signal that may be provided to the comparator 40.

The output of the DAC is the variable reference signal 35, $V_{ref}$, which is, in turn, added to the output of the active hysteresis circuit 60 at a summing junction 37. As previously discussed, the active hysteresis circuit 60 is disabled during the first operating mode. The output of the active hysteresis circuit 60 is, therefore, a generally constant value that is added to the variable reference signal 35, $V_{ref}$, and provided as a first input signal 42 at the non-inverting input terminal of the operational amplifier 50. Preferably, the output of the active hysteresis circuit 60 is maintained at a generally constant value that will not offset the variable reference signal 35, $V_{ref}$, from its setpoint. As a result, the variable reference signal 35, $V_{ref}$, is provided to the operational amplifier 50 as the first input signal 42 during the first operating mode.

During the first operating mode, then, the variable reference signal 35, $V_{ref}$, is compared to the sensed and filtered (if filter(s) 30 are present) analog input signal provided as the second input 44 to the inverting terminal of the operational amplifier 50. The value of the variable reference signal 35, $V_{ref}$, is set to a maximum expected value of the analog input signal at the lowest operating speed of the machine 5 for which control is desired. When the magnitude of the analog input signal 44 is less than the reference signal 42, the output 52 of the comparator op-amp 50 is equal to the positive voltage reference 46, $V_{cc}$, and is illustrated in FIG. 6C as a logical one. When the analog input signal 44 becomes equal to the reference signal 42, the output 52 of the comparator changes state and is equal to the negative voltage reference 48. As illustrated, the negative voltage reference 48 is an earth ground and is illustrated in FIG. 6C as a logical zero.

The output of the comparator 50 is provided as an input to the processor 70 generating the desired reference signal. During the first operating mode, the processor 70 outputs the first reference signal. At time $t_2$ in FIG. 6, the processor 70 detects the change in state of the output 52 signal from the comparator 50 and enters the second operating mode. In the second operating mode, the desired reference signal is set to a second reference signal which is a value less than the expected minimum value of the analog input signal. As will be discussed in more detail below, the output 52 of the comparator 50 transitions back to a logical one at time $t_3$. At time $t_3$, therefore, the processor 70 detects the transition back to the first operating mode and again outputs the first reference signal. As the output 52 of the comparator 50 transitions between the positive voltage reference 46 (i.e., logical one) and the negative voltage reference 48 (i.e., logical zero), the processor 70 alternates between supplying the first reference signal and the second reference signal, respectively, to the DAC 34 in the input circuit.

During the second operating mode, the active hysteresis circuit 60 is enabled. The magnitude of the voltage for the output signal 52 from the comparator op-amp 50 is used to toggle the pair of transistors 62, 64 and thereby enable/disable operation of the active hysteresis circuit 60. In the second operating mode, the active hysteresis circuit 60 is active and the resistor 66 and capacitor 68, acting in combination define a resistive-capacitive circuit and the associated R-C response generates a varying voltage present at the summing junction 37 with the variable reference signal 35, $V_{ref}$. The output of the active hysteresis circuit 60 is combined with the variable reference signal 35, $V_{ref}$, to generate a variable reference signal as illustrated in FIG. 6B between times $t_2$ and $t_3$.

Setting the variable reference signal 35 to a value much less than the magnitude of the analog input signal removes the potential for toggling of the output signal 52 when the analog signal is near its maximum value. When the electric machine 5 is operating at a low speed, the potential for some speed fluctuation and/or some vibration in the machine exists. If the speed varies, the magnitude of the analog input signal 17 will vary. Similarly, if vibration is present in the machine 5, the result is a variation in speed of the machine 5 and, in turn, a variation in the magnitude of the analog input signal 17. If there is variation in the magnitude of the analog input signal when the analog input signal is close to the variable reference signal 35 against which it is compared, the output of the comparator 52 may toggle on and off once or several times according to the variation and/or vibration present in the machine. Rapid toggling of the output signal 52 due to this variation and/or vibration would appear to the processor 70 as if the machine 5 is operating at a high rate of speed in which the analog input signal has actually transitioned through a complete cycle of the periodic waveform and the processor 70 may determine an erroneous speed at which the machine 5 is rotating. Thus, upon the initial detection of the transition of the output signal 52, the processor 70 similarly transitions to the second reference signal and prevents further erroneous changes in state from occurring.

As also observed in FIG. 6B, the resistive-capacitive circuit resulting in the active hysteresis circuit 60 creates an input 42 to the comparator 50 that varies with time. This varying value of the reference signal 35, $V_{ref}$, in combination with the output of the active hysteresis circuit 60 is provided as a first input signal 42 to the non-inverting input terminal of the op-amp and is compared to the analog input signal 44 at the inverting terminal of the operational amplifier 50. The value of the variable reference signal 35, $V_{ref}$, is set to a minimum value and allowed to rise over time as a function of the R-C time constant until it approaches the minimum expected value of the analog input signal at the lowest operating speed of the machine 5 for which control is desired. While the magnitude of the analog input signal 44 remains greater than the reference signal 42, the output 52 of the comparator op-amp 50 stays at the negative voltage reference 48 or logical zero, as shown in FIG. 6C. When the analog input signal 44 drops below the reference signal 42 at time $t_3$, the output 52 of the comparator changes state and returns to the positive voltage reference 46 or logical one. As previously discussed, the processor 70 detects the transition back to the first operating mode and again outputs the first reference signal. The above described sequence repeats as the analog input signal 17 continually detects the presence or absence of teeth 14 and generates the analog input signal 17 accordingly.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. An input circuit for detecting an analog signal, the input circuit comprising:
   a terminal configured to receive the analog signal at the input circuit;
   a variable reference signal operative to equal a first reference signal in a first operating mode and a second reference signal in a second operating mode, wherein the first reference signal is a different magnitude than the second reference signal;
   a comparator circuit including a first input, a second input, and an output, wherein the second input is operative to receive the analog signal; and
   an active hysteresis circuit including an input and an output, wherein:
   the input of the active hysteresis circuit is configured to receive the output from the comparator circuit, the output of the active hysteresis circuit is added to the variable reference signal, the first input of the comparator circuit is operative to receive the variable reference signal added to the output of the active hysteresis circuit, the output of the active hysteresis circuit is a constant value in the first operating mode, and the output of the active hysteresis circuit is a varying value during the second operating mode.

2. The input circuit of claim 1 further comprising:
a processor operative to output a digital signal corresponding to a desired reference signal; and
a digital to analog converter having an input and an output, wherein the input is configured to receive the digital signal from the processor and the output is the variable reference signal.

3. The input circuit of claim 2 wherein the desired reference signal is a first constant value corresponding to the first reference signal in the first operating mode.

4. The input circuit of claim 2 wherein the desired reference signal is a second constant value corresponding to the second reference signal in the second operating mode.

5. The input circuit of claim 1 wherein the output of the active hysteresis circuit is a function of a resistive-capacitive circuit to generate the varying value during the second operating mode.

6. The input circuit of claim 1 wherein the output of the comparator circuit is a first value when the first input signal is greater than the second input signal and the output of the comparator circuit is a second value when the first input signal is less than the second input signal.

7. The input circuit of claim 6 wherein the first operating mode is selected when the output of the comparator is the first value and the second operating mode is selected when the output of the comparator is the second value.

8. The input circuit of claim 1 wherein the input circuit is configured to receive at the terminal of the input circuit a time variant analog signal with an amplitude that varies periodically between a maximum value and a minimum value with respect to time and wherein the variable reference signal is the first reference signal during a first half cycle of the time variant analog signal and the variable reference signal is the second reference signal during a second half cycle of the time variant analog signal.

9. A method of detecting an analog signal with an input circuit, the method comprising the steps of:
receiving the analog signal at a terminal of the input circuit;
generating a variable reference signal with the input circuit, wherein the variable reference signal is a first reference signal in a first operating mode and a second reference signal in a second operating mode, wherein the first reference signal is a different magnitude than the second reference signal;
disabling an active hysteresis circuit in the input circuit during the first operating mode;
enabling the active hysteresis circuit in the input circuit during the second operating mode, wherein:
the active hysteresis circuit includes an input and an output,
the input of the active hysteresis circuit is configured to receive an output of a comparator circuit, and
the output of the active hysteresis circuit is added to the variable reference signal during the second operating mode;
comparing the analog signal to the variable reference signal at the comparator circuit in the first operating mode, wherein the variable reference signal is a first input signal and the analog signal is a second input signal to the comparator circuit in the first operating mode; and
comparing the analog signal to a sum of the output of the active hysteresis circuit and the variable reference signal at the comparator circuit in the second operating mode, wherein the sum of the output of the active hysteresis circuit and the variable reference signal is the first input signal and the analog signal is the second input signal to the comparator circuit in the second operating mode.

10. The method of claim 9 wherein the step of disabling the active hysteresis circuit includes generating a constant output value from the active hysteresis circuit in the first operating mode, the method further comprising the step of adding the output of the active hysteresis circuit to the variable reference signal during the first operating mode and, wherein the sum of the output of the active hysteresis circuit and the variable reference signal is compared to the analog signal in the first operating mode.

11. The method of claim 9 wherein the output of the active hysteresis circuit is a varying value during the second operating mode.

12. The method of claim 11 wherein the varying value is a function of a resistive-capacitive circuit.

13. The method of claim 9 wherein the output of the comparator circuit is a first value when the first input signal is greater than the second input signal and the output of the comparator circuit is a second value when the first input signal is less than the second input signal.

14. The method of claim 13 further comprising the steps of:
selecting the first operating mode when the output of the comparator is the first value, and
selecting the second operating mode when the output of the comparator is the second value.

15. An input module for an industrial controller, the input module comprising:
a terminal configured to receive an analog signal;
a variable reference signal set to a first reference signal in a first operating mode and a second reference signal in a second operating mode, wherein the first reference signal is a different magnitude than the second reference signal;
a comparator circuit including a first input, a second input, and an output, wherein the second input is operative to receive the analog signal; and
an active hysteresis circuit including an input and an output, wherein:
the input of the active hysteresis circuit is configured to receive the output from the comparator circuit,
the active hysteresis circuit is configured to generate an output signal having a constant value in the first operating mode, and
the active hysteresis circuit is configured to generate an output signal having a varying value in the second operating mode, and
the first input of the comparator circuit is configured to receive a sum of the variable reference signal and the output signal from the hysteresis circuit.

16. The input module of claim 15 wherein the output signal of the active hysteresis circuit is a function of a resistive-capacitive circuit to generate the varying value during the second operating mode.

17. The input module of claim 15 further comprising:
a processor operative to output a digital signal corresponding to a desired reference signal; and
a digital to analog converter having an input and an output, wherein the input is configured to receive the digital signal from the processor and the output is the variable reference signal.

18. The input module of claim 15 wherein:
the industrial controller includes a processor module in communication with the input module,
the processor module has a processor operative to output a digital signal corresponding to a desired reference signal, and
the digital signal is transmitted from the processor module to the input module, the input module further comprising:
a digital to analog converter having an input and an output, wherein the input is configured to receive the digital signal from the processor module and the output of the digital to analog converter is the variable reference signal.

19. The input module of claim 15 wherein the output of the comparator circuit is a first value when the first input signal is greater than the second input signal and the output of the comparator circuit is a second value when the first input signal is less than the second input signal.

20. The input module of claim 19 wherein the first operating mode is selected when the output of the comparator is the first value and the second operating mode is selected when the output of the comparator is the second value.

* * * * *